United States Patent [19]

Pein

[11] Patent Number: 5,432,739
[45] Date of Patent: Jul. 11, 1995

[54] NON-VOLATILE SIDEWALL MEMORY CELL METHOD OF FABRICATING SAME

[75] Inventor: Howard B. Pein, Briarcliff Manor, N.Y.

[73] Assignee: Philips Electronics North America Corporation, New York, N.Y.

[21] Appl. No.: 261,511

[22] Filed: Jun. 17, 1994

[51] Int. Cl.6 .................... G11C 11/40; H01L 29/68
[52] U.S. Cl. ........................ 365/185; 365/94; 365/104; 257/302; 437/52
[58] Field of Search .............. 365/185, 500, 94, 104; 257/302, 315, 318, 324, 329; 437/52

[56] References Cited

U.S. PATENT DOCUMENTS

| | | | |
|---|---|---|---|
| 4,974,060 | 11/1990 | Ogasawara | 257/302 |
| 5,011,526 | 3/1991 | Gotou | 257/302 |
| 5,017,977 | 5/1991 | Richardson | 365/185 |

FOREIGN PATENT DOCUMENTS 2-193153  3/1992  Japan .

*Primary Examiner*—Joseph A. Popek
*Assistant Examiner*—Tan Nguyen
*Attorney, Agent, or Firm*—David Schreiber

[57] ABSTRACT

A non-volatile memory cell and array of such cells is provided. The memory cell includes a single transistor floating gate cell fabricated on a sidewall of a silicon pillar etched into a silicon substrate. The memory cells are arranged in an array of rows extending in a bit line direction and columns extending in a word line direction. A substantially smaller cell and array size is realized by limiting the dimension of the pillar and the bit line in the word line direction to be the minimum line width as limited by the lithography.

8 Claims, 4 Drawing Sheets

NON-VOLATILE SIDEWALL MEMORY CELL METHOD OF FABRICATING SAME

BACKGROUND OF THE INVENTION

This invention relates generally to a non-volatile memory cell formed on the sidewall of a silicon pillar etched into a silicon substrate and the method of fabricating same. A vertical non-volatile memory cell and array are shown in Japanese Application No. 2-193153. This memory cell includes a drain region on top of a silicon pillar. The drain region includes a contact opening in the passivating dielectric for connection to a bit line for connection to other cells in the memory array. The dimension of the drain contact opening is the minimum line width of the process lithography. The contact opening lies entirely on the top surface of the silicon pillar. Therefore, the silicon pillar is required to be larger than the minimum lithographically definable diameter to account for the registration tolerance between the edge of the contact opening and the edge of the silicon pillar.

Furthermore, the bit line, which is conventionally an etched metal line, is required to overlap the edge of the drain contact opening to protect the underlying contact region. For this reason, the width of the bit line must be larger than the minimum definable line width. These requirements, resulting from the bit line contact opening lying entirely on the top surface of the pillar, result in a cell size that is larger than would be realized if the drain contact registration tolerances for the silicon pillar and metal bit line could be avoided.

SUMMARY OF THE INVENTION

It is an object of the invention to provide a sidewall nonvolatile memory cell and array of such cells that avoids the inclusion of registration tolerance within the silicon pillar and bit line dimensions and to have the line width be the minimum lithographically definable dimension, thereby realizing a substantially smaller cell and array size.

It is another object of the invention to provide a method of fabricating a memory cell and array of such memory cells which forms minimum line width bit lines and silicon pillars that make contacts having the contact overlapping the edges of the silicon pillar.

It is yet another object of the invention to provide a nonvolatile memory cell which has a current drive which is more than twice that of a comparable planar device.

It is still another object of the invention to provide a non-volatile memory cell having a significantly lower bit-line capacitance than found in conventional dense non-volatile memory cells.

It is still yet a further object of the invention to provide a sidewall non-volatile memory cell and array of such cells that substantially reduces the cell size as compared with conventional planar non-volatile cells and thus provides a more dense memory array.

These and other objects of the invention are provided by a memory cell which is implemented using a single transistor floating gate cell that is fabricated on the sidewall of a silicon pillar etched into a silicon substrate. Data is stored by injecting charge into the floating polysilicon gate that completely surrounds the silicon pillar. Current flows in the vertical direction with the drain of the transistor located at the top of the pillar and source lying at the pillar base. Charge is injected into the floating gate by hot-electron injection when the appropriate programming voltages are applied. A second polysilicon layer, separated from the floating gate by a dielectric layer surrounds the floating gate and serves as a control gate.

When the memory cell is implemented in an array, the second polysilicon layer forms a self-aligned word line. This is accomplished by reducing the space between the silicon pillars in the word line direction to the minimum lithographic dimension so that the second polysilicon layer surrounding the floating gate merges together to form a single word line. To insure that the adjacent word lines remain isolated, the spacing between pillars along the bit line direction is made slightly larger than the minimum spacing in the word line direction. Thus, with an optimally thick second polysilicon layer, the polysilicon between pillars in the word line direction will merge, but will remain separate in the bit line direction. Then after selective anisotropic etching of the second polysilicon gate material, isolated continuous word lines are created.

To achieve the smallest possible cell size, the bit line contact opening to the top of the silicon pillar is allowed to overlap the edges of the pillar. The bit line is formed by etching a continuous trench in the planarizing dielectric to expose the tops of all of the pillars along a given bit line. This contact trench opening has a minimum sized width as does the silicon pillar. Following a blanket metal deposition, the metal is etched back so that only the metal within the contact trenches remains while the metal lying on the surface of the dielectric is removed. In this way, the width of the metal bit line is determined by the contact trench width which is the minimum line width.

The resulting cell dimension has a minimum pitch in the word line direction consisting of a minimum sized pillar and a minimum sized spacing between pillars, while in the bit line direction, the pillar has a minimum sized width and a spacing between pillars only slightly larger than the minimum spacing. The overall cell size is thus only slightly larger than the square of the minimum pitch. This is significantly smaller than the conventional planar cells and is also a substantial improvement over the vertical cell with the contact opening lying entirely on top of the silicon pillar.

The source is formed by a sunken n+ ground plane which is common to all cells. An implantation step is performed to form the source and drain regions.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENT

Figure 1:
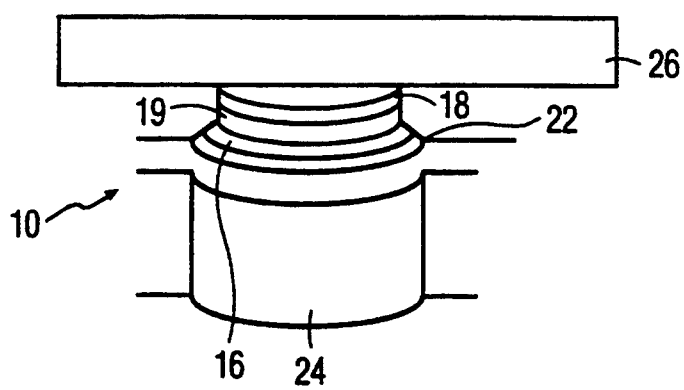
FIG. 1 is a schematic view of a sidewall non-volatile memory cell in accordance with a preferred embodiment of the invention.
Figure 3A:
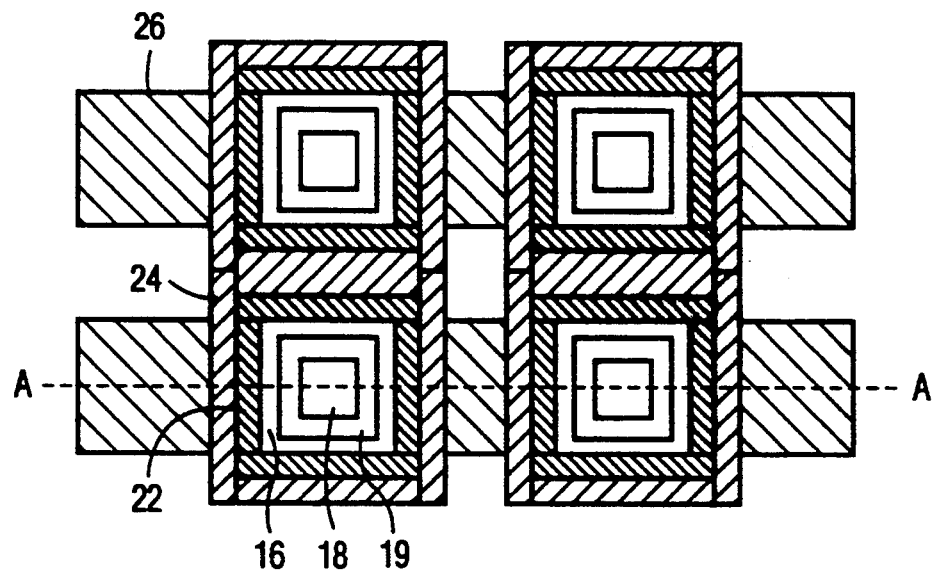
FIG. 3A is a plan view of a surrounding gate sidewall EPROM array with fully surrounded pillars in accordance with a preferred embodiment of the invention.
Figure 3B:
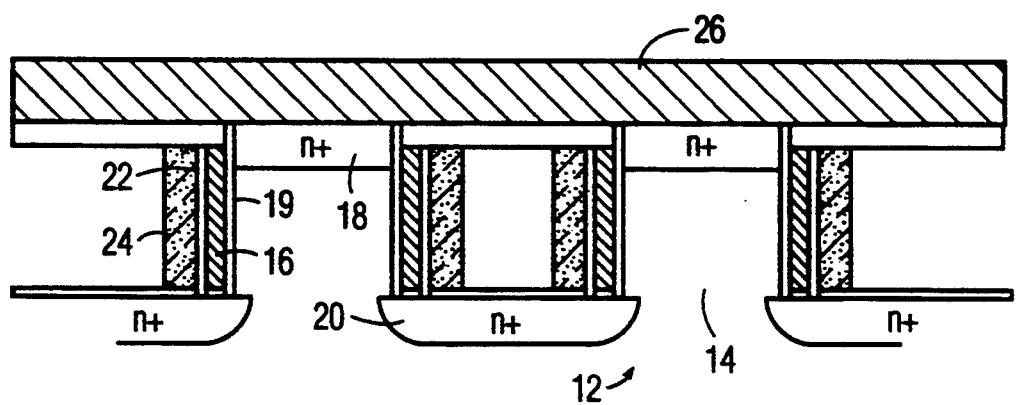
FIG. 3B is a cross-sectional view of the array taken along the line A—A of FIG. 2.

Reference is had to FIGS. 1, 3A and 3B which show several views of a sidewall non-volatile memory cell 10 in accordance with the invention. Memory cell 10 includes a transistor 12 formed on a sidewall of a silicon pillar 14. Data is stored in cell 10 by injecting charge into floating gate 16 which completely surrounds silicon pillar 14. Transistor 12 includes a drain 18 positioned on top of silicon pillar 14 and a source 20 positioned at a base of silicon pillar 14. Floating gate 16 is separated from drain 18 by a dielectric 19. Current flows in a vertical direction from drain 18 to source 20. Charge is injected into floating gate 16 by hot-electron injection when appropriate programming voltages are applied thereby raising the threshold voltage of the device above the read voltage applied to the word line. Cell 10 also includes a control gate 24 separated from floating gate 16 by an inter-gate dielectric 22.

Figure 2:
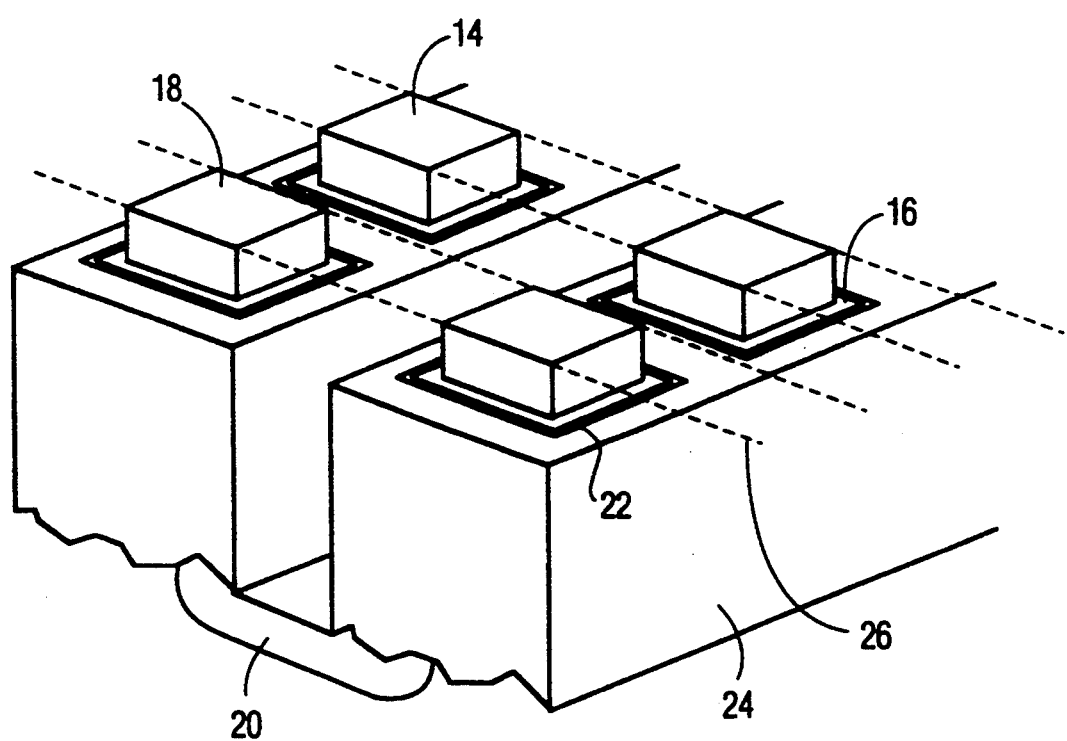
FIG. 2 is an elevational view of a sidewall non-volatile memory array in accordance with a preferred embodiment of the invention.
Figure 4:
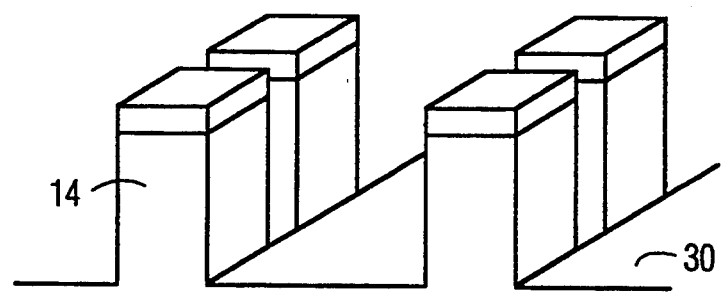
FIG. 4 shows the memory array after the step of etching the silicon pillars in accordance with a preferred embodiment of the invention.

Reference is now also had to FIG. 2 which shows an array 100 of memory cells 10. A plurality of memory cells 10 are arranged in an array of rows extending in a bit line direction and columns extending in a word line direction. Control gate 24 of each cell 10 also serves as a word-line. A continuous word-line is formed by minimizing the space between silicon pillars 14 in the word-line direction so that control gates 24 surrounding silicon pillars 14 merge in the word-line direction. The spacing between silicon pillars 14 in the bit line direction is made slightly larger than in the word line direction so that the word line polysilicon surrounding the pillars does not merge between pillars in adjacent word line rows. Source 20 is shared by all cells 10 and may be arranged in a honeycomb configuration with a single contact located at an edge of array 100. A metal bit-line 26 contacts drain 18 of each cell 10 to form a self-aligned bit line for array 100. Source 18 is formed by a sunken n+ ground plane which is common to each of cells 10 in array 100. The dimension of silicon pillar 14 in the word line direction and the dimension of bit line 26 in the word line direction equals the minimum line width.

Figure 5:
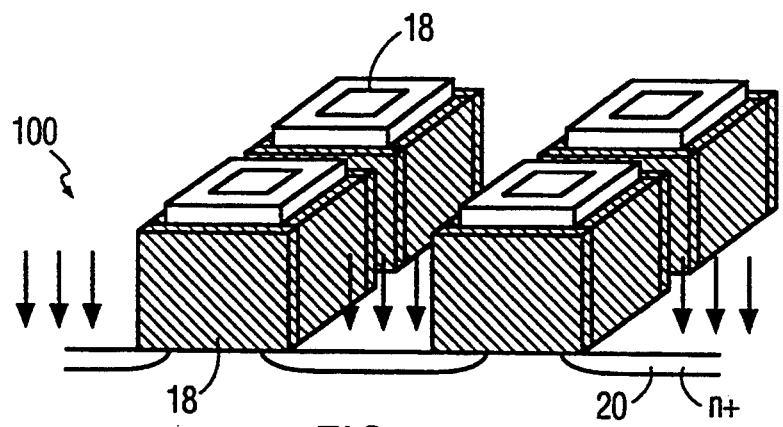
FIG. 5 shows the memory array after the steps of growing a gate oxide, depositing a floating gate, etching the sidewall spacers and forming source/drain diffusion and ground lines in accordance with a preferred embodiment of the invention.

Reference is now had to FIGS. 4–9 which illustrate the method of fabricating array 100 of memory cells 10 shown in FIG. 2. Beginning with FIG. 4, a plurality of silicon pillars 14 is formed in a silicon substrate 30 using anisotropic etching. The etching also serves to form a word line trench between rows of pillars 14. FIG. 5 shows the array after first growing a gate oxide to form dielectric 19 (shown in FIG. 3) over array 100, then depositing polysilicon. An etch is then performed to form floating gates 18. An n+ implantation step then occurs to form drains 18 and source 20.

Figure 6:
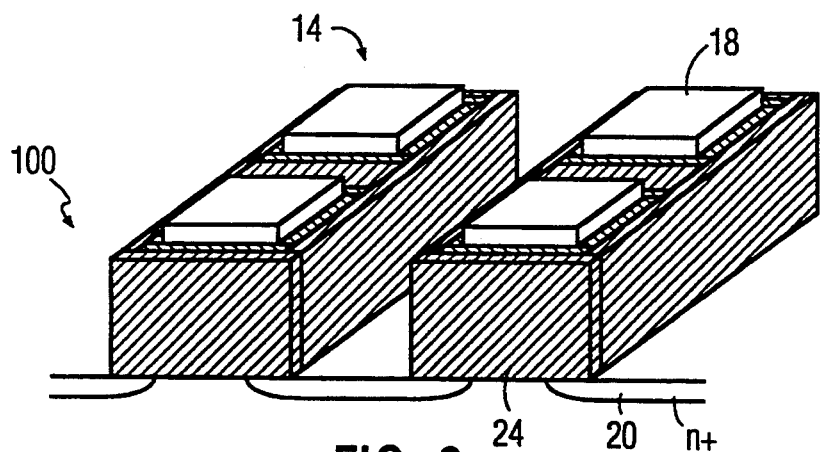
FIG. 6 shows the memory array after the steps of growing the inter-gate dielectric, depositing the control gate material and etching to form word lines in accordance with a preferred embodiment of the invention.
Figure 7:
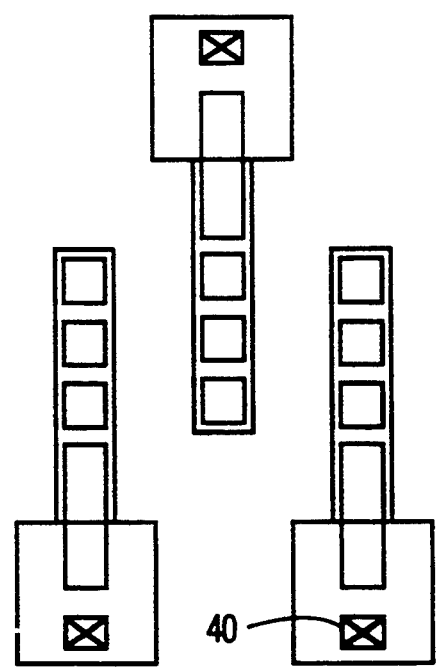
FIG. 7 shows the memory array with the final silicon island in a row extended to provide more space to contact the word line.
Figure 8:
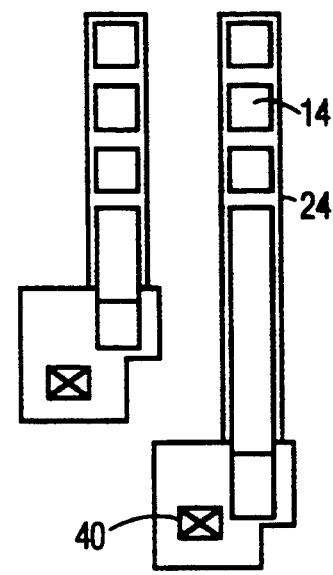
FIG. 8 shows the memory array after placing all word-line contacts on the same edge of the array.

Reference is now had to FIG. 6 which shows array 100 after the steps of growing inter-gate dielectric 22, depositing another layer of polysilicon material and etching to form control gates 24. Isolation regions between silicon pillars 14 in the direction of the word-line will be completely filled in with gate material so that control gates 24 will be continuous. A word-line contact 40 is formed at the end of each control gate 24 by extending the last silicon pillar in each row to provide additional space to make a contract. This is shown in FIG. 7. It is possible at this point to form a spacer covering the sidewall gate stack to allow selective etching of the planarizing oxide. This will ease the etching tolerances required when exposing the tops of silicon pillars 14 to make contact to bit-lines 26. Word-line contacts 40 can be made with connections alternating from top to bottom of array 100 (not shown) or all on the same side of array 100. This is shown in FIG. 8.

Figure 9:
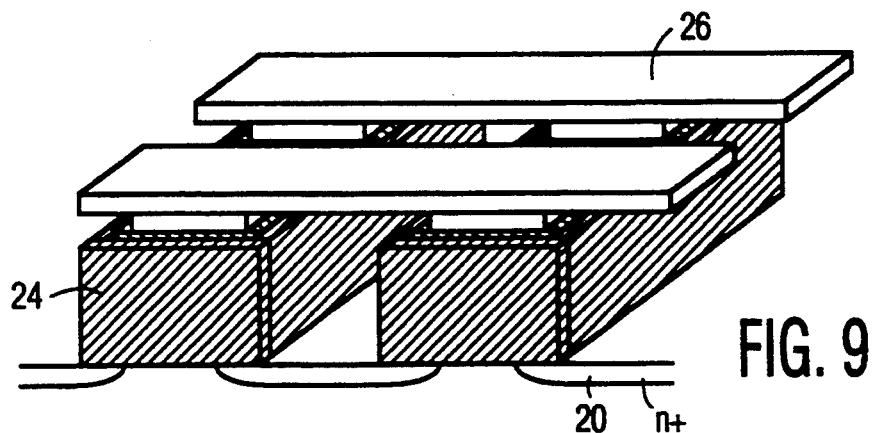
FIG. 9 shows the memory array after the steps of forming a planarizing dielectric layer etching a contact trench to expose the tops of the pillars along the bit line, depositing metal and then etching back the metal to remove the metal between adjacent bit line contact trenches.

Reference is now had to FIG. 9 which shows array 100 after formation of bit-lines 26. A planarizing dielectric is deposited over array 100 and planarized to fill in the regions between control gates 24 (not shown). Two contact masks are used to form contacts in the array. The first contact mask is used to make contact cuts through the planarizing dielectric to source 18 of array 100 and to each control gate 24 before bit-line metallization is performed. A plug technology is used to fill the contact holes. The second contact mask is used to form bit lines by etching contact trenches within the planarizing dielectric to expose the tops of the pillars along the bit line. Metal is then deposited and etched back so that the metal on the dielectric surface is removed, but the metal within the contract trenches remains, thereby forming self-aligned bit lines.

It will thus be seen that the objects set forth above among those made apparent from the preceding description, are efficiently attained and, since certain changes may be made in carrying out the above method and in the construction set forth without departing from the spirit and scope of the invention it is intended that all matter contained in the above description and shown in the accompanying drawings shall be interpreted as illustrative and not in a limiting sense.

It is also understood that the following claims are intended to cover all of the generic and specific features of the invention herein described and all statements of the scope of the invention which, as a matter of language, might be said to fall therebetween.

What is claimed is:

1. A non-volatile memory formed on a silicon substrate comprising:

a plurality of memory cells arranged in an array of rows of memory cells extending in a bit line direction and columns of memory cells extending in a word line direction, each of said memory cells including a silicon pillar formed in said silicon substrate, a drain region formed on a top side of said pillar, a floating gate surrounding said pillar, separated from said pillar by a first dielectric layer, a second dielectric layer surrounding said floating gate and a control gate surrounding said second dielectric layer;

each of said control gates integrally formed to form a single word line for each column; and a bit line joined to each of said drain regions of each memory cell in a row extending in said bit line direction, said dimension of said bit line and said pillar in said word line direction being equal to a minimum line width.

2. The memory of claim 1, further including a source region formed in said substrate, said source region shared by each of said memory cells.

3. The memory of claim 1, wherein a distance between contiguous pillars in a column is the minimum line width.

4. The memory of claim 3, wherein a dimension of one of said pillars in said bit line direction is the minimum line width.

5. The memory of claim 4, wherein a distance between contiguous pillars in said bit line direction is greater than the minimum line width.

6. A non-volatile memory cell formed on a silicon substrate comprising:

a silicon pillar formed in said silicon substrate, a drain region formed on a top side of said pillar;

a floating gate surrounding said pillar, separated from said pillar by a first dielectric layer;

a second dielectric layer surrounding said floating gate and a control gate surrounding said second dielectric layer; and a bit line joined to said drain region extending in said bit line direction, said dimension of said bit line and said pillar in said word line direction being equal to a minimum line width.

7. The memory of claim 6, further including a source region formed in said substrate.

8. The memory of claim 7, wherein a dimension of said pillar in said bit line direction is the minimum line width.

* * * * *